United States Patent [19]

Soda et al.

[11] Patent Number: 5,017,458

[45] Date of Patent: May 21, 1991

[54] METHOD FOR PRODUCTION OF GRAFT COPOLYMER, PATTERN REPLICATION METHOD, AND BASE POLYMER AND RESIST FOR GRAFT COPOLYMERIZATION

[75] Inventors: Yasunari Soda; Kozo Mochiji, both of Hachioji; Hiroaki Oizumi, Kokubunji; Takeshi Kimura, Higashimurayama, all of Japan

[73] Assignee: Hitachi, Ltd., Tokyo, Japan

[21] Appl. No.: 354,116

[22] Filed: May 22, 1989

[30] Foreign Application Priority Data

May 27, 1988 [JP] Japan ................................ 63-128394

[51] Int. Cl.[5] ............................................... G03F 7/26
[52] U.S. Cl. .................................... 430/296; 430/325; 430/324; 430/330; 430/942; 430/967; 430/328; 522/915
[58] Field of Search ............... 430/325, 324, 330, 296, 430/942, 967, 328; 522/915

[56] References Cited

U.S. PATENT DOCUMENTS 4,960,676  10/1990  Mochiji et al. ................. 430/967 X

FOREIGN PATENT DOCUMENTS 2468932  5/1981  France .............................. 430/325

OTHER PUBLICATIONS

Gazard et al, "Lithographic Technique Using Radiation-Induced Grafting of Acrylic Acid into Poly(methylmethacrylate) Films", *Poymer Engineering and Science*, Nov. 1980, vol. 20, No. 16, pp. 1069-1072.

*Primary Examiner*—Cynthia Hamilton
*Attorney, Agent, or Firm*—Antonelli, Terry, Stout & Kraus

[57] ABSTRACT

The method for production of a graft copolymer according to the present invention includes the step of adding to a base polymer capable of forming first radicals when irradiated with radiation an additive capable of combining with said first radicals to form second radicals stable against oxygen, the step of irradiating said base polymer containing the additive with radiation, and the step of introducing a monomer under an atmosphere free from oxygen, thereby to graft copolymerize said irradiated base polymer and said monomer.

9 Claims, 2 Drawing Sheets

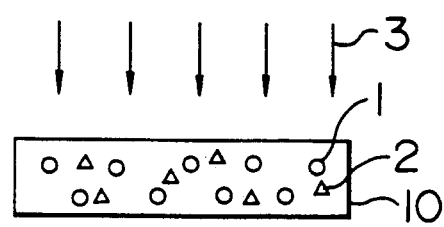
F I G. 1A
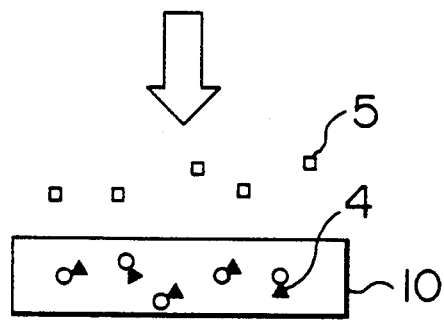
F I G. 1B
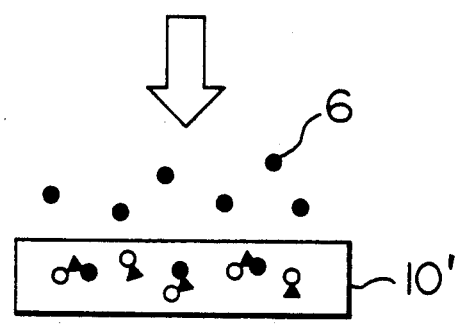
F I G. 1C

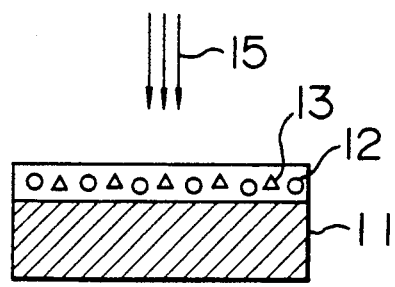
F I G. 2A
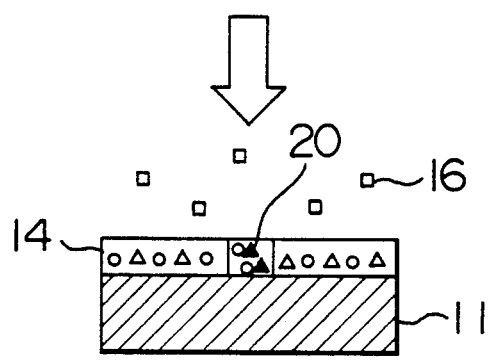
F I G. 2B
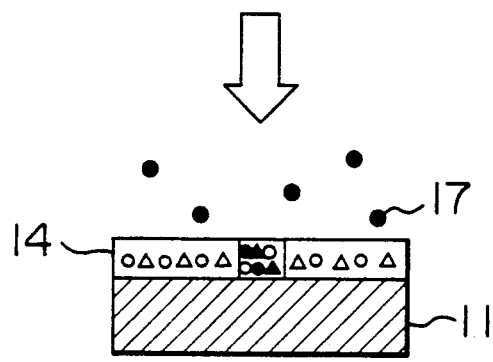
F I G. 2C
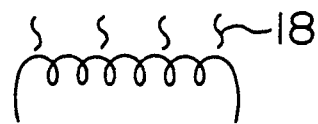
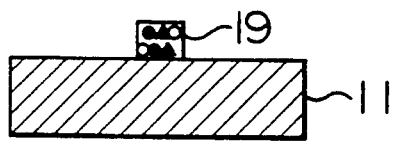
F I G. 2D

METHOD FOR PRODUCTION OF GRAFT COPOLYMER, PATTERN REPLICATION METHOD, AND BASE POLYMER AND RESIST FOR GRAFT COPOLYMERIZATION

BACKGROUND OF THE INVENTION

The present invention relates to a method for production of graft copolymers using radiations such as ultraviolet ray, electron beam, and γ-rays; a pattern replication method which uses the method for production of graft copolymers; and a base polymer and a resist for graft copolymerization.

Production of graft copolymers and block copolymers (hereinafter these are referred to as "graft copolymers") by radiation induced graft copolymerization was discussed in (1) "Journal of Polymer Science", vol. 34, 1959, pages 419–438, (2) "Polymer Engineering and Science", November, 1980, vol. 20, No. 16, pages 1069–1072 and (3) U.S. Pat. No. 4,195,108.

Radiation induced graft copolymerization is to polymerize a monomer using radicals generated by irradiating a base polymer with radiation as an initiation point of reaction. This method makes it possible to produce copolymers comprising two different molecular units which cannot be produced by conventional method. However, as mentioned in the above literature (1), this method has the problem that radicals of the base polymer recombine with oxygen in the air to lose the function as initiation point of polymerization. That is, radicals are quenched and so production efficiency of copolymer which is a reaction product greatly decreases by oxygen in the air.

When graft copolymerization reaction is utilized according to the above conventional technique, it is preferred to carry out, in vacuo, all of the steps from irradiation of radiation to supply of monomer to be graft polymerized, taking into consideration the quenching of radicals of the base polymer. On the other hand, irradiation chamber and graft copolymerization chamber must be integrated and thus construction of apparatus is severely limited. If it becomes possible to once expose the steps to the air, these chambers can be separated and the graft polymerization reaction can be sufficiently induced by conventional apparatuses. Especially, separation of these chambers is desired for resist pattern fabrication process with graft polymerization which is one step in production of large scale integrated circuit. The above-mentioned conventional techniques gave no consideration in this respect.

SUMMARY OF THE INVENTION

The object of the present invention is to provide a method for production of graft copolymerization which shows no reduction of graft copolymerization reaction efficiency caused by oxygen in the air; a pattern replication method using this method for production of graft copolymers; a base polymer for graft copolymerization; and resists.

The above object can be accomplished by carrying out graft copolymerization using a base polymer for graft copolymerization to which is added a material (additive) which combines with radicals in the base polymer generated by irradiation to form radicals stable against oxygen.

The most preferred as such additive is a spin trap used in electron spin resonance method.

Furthermore, in case of pattern replication by radiation lithography, there may be used a resist for graft copolymerization to which the above additive is added.

According to the present invention, it is possible to improve efficiency of radiation induced graft polymerization reaction and, especially, the present invention has a conspicuous effect for prevention of reduction in efficiency caused by oxygen in the air.

BRIEF DESCRIPTION OF THE DRAWINGS

FIGS. 1A–1C show a flow sheet for explanation of Example 1 of the present invention FIGS. 2A–2D show a flow sheet for explanation of Example 2 of the present invention.

DESCRIPTION OF THE PREFERREd EMBODIMENTS

First, the theory of the present invention will be explained.

The air reduces the efficiency of graft polymerization reaction because radicals of base polymer generated by irradiation are quenched by oxygen in the air. Therefore, other materials such as spin trap as mentioned above are previously added to the base polymer. This brings about the reaction A·+B→A−B· (A·: radical of base polymer and B: additive) to cause change in electron state. Even though radical A· readily combines with oxygen and there occurs quenching by oxygen, if this radical A· is converted into different radical A−B·, it is possible to make the radical A−B· of the additive B not to react with oxygen. If radical A · is stabilized by converting into radical A−B· in this way, the base polymer is not affected by the atmosphere even if it is exposed to the air, namely, oxygen. Thereafter, graft polymerization reaction can be carried out using radical A−B· as an initiation point of polymerization by exposing the base polymer to a reactive gas such as monomer.

The additive which reacts with radicals of base polymer also stabilizes radicals of short life which are quenched before graft polymerization reaction irrespective of the presence of oxygen. Thus, such additive not only prevents the reduction of production efficiency of graft copolymer due to the oxygen in the air, but also can improve the production efficiency even in vacuum atmosphere.

Furthermore, when pattern is replicated using a resist containing the additive such as spin trap, the generated radicals are not quenched with oxygen and hence irradiation can be performed in the air and thus production equipment can be simplified.

Examples of the present invention will be explained referring to the drawings.

EXAMPLE 1

This Example shows graft copolyemrization of styrene as a monomer on polyethylene as a base polymer.

Sequence of the steps is shown in FIGS. 1A–1C. First, 10% by weight of phenyl-N-butylnitrone 2 was added as an additive to polyethylene 1 as a base polymer and compound film 10 was formed therefrom (FIG. 1A). Spin traps are known as materials which combine with radicals which may be quenched during measurement in electron spin resonance to produce radicals of long life. The spin traps are materials suitable in the present invention and phenyl-N-butylnitrone which is one of them was used here. The resulting compound film 10 was irradiated with 10 Mrad of γ-ray 3 in vacuo (FIG. 1A). Radicals of polyethylene 1 generated in compound film 10 combined with phenyl-N-butylnitrone 2 to form nitroxide radicals 4 (FIG. 1B). Compound film 10 was once taken into the air containing oxygen 5 and then taken in a graft copolymerization chamber (not shown). Immediately thereafter, the graft copolymerization chamber was evacuated. Taking out and in of compound film 10 required 5 minutes, during which compound film 10 was exposed to the air (oxygen 5). Then, vapor of styrene 6 as a monomer was supplied into the graft copolymerization chamber to start graft copolymerization reaction with the nitroxide radicals 4 (FIG. 1C). Reaction time was 2 hours. As a result, graft copolymer film 10' of polyethylene and styrene was formed. In this case, a grafting ratio of 0.4 was obtained. The above steps were all effected at room temperature. For comparison, the similar graft copolymerization reaction was carried out without using the additive, phenyl-N-butylnitrone 2, namely, radicals of polyethylene 1 as a base polymer were directly reacted with styrene 6 as a monomer. The resulting grafting ratio was 0.02, which was 1/20 of the grafting ratio obtained when the additive was used.

The irradiation step in Example 1 may be carried out in oxygen atmosphere such as the air. Furthermore, the base polymer may be heated at graft polymerization step for acceleration of the reaction or irradiated with ultraviolet ray or visible ray in place of the heating. Further ultraviolet ray, electron beam or X-ray may be irradiated in plate of γ-ray.

EXAMPLE 2

This Example shows application of the present invention to pattern replication (lithography) which utilizes radiation induced graft copolymerization.

FIG. 2A-2D show sequence of steps.

On Si wafer 11 (substrate) was formed resist film 14 of 0.4 μm thick by spin coating thereon polymethyl methacrylate (hereinafter referred to as "PMMA") 12 as a resist to which nitrosobenzene 13 as an additive was added (FIG. 2A). Nitrosobenzene 13 was also known as one of spin traps mentioned above. Addition amount of nitrosobenzene 13 was 10% by weight. Next, this wafer 11 was taken in an electron beam writing machine (not shown) and selectively irradiated with 4 μC/cm² of electron beam 15,. Electronic energy in this case was 30 KeV and irradiation was carried out in vacuo to avoid scattering of electron. As a result, radicals of PMMA 12 generated in the irradiated resist film 14 combined with nitrosobenzene 13 to form radicals 20 (FIG. 2B). Then, the wafer 11 was taken out from the electron beam writing machine and then taken in a graft copolymerization chamber, which was then evacuated to vacuum. During this period the wafer 11 was exposed to the air containing oxygen 16 for 2 minutes (FIG. 2B). Vapor of acrylic acid 17 as a monomer was introduced into the graft copolymerization chamber (FIG. 2C). Wafer 11 was heated here to about 110° C. by heat source 18 to further accelerate the graft copolymerization reaction (FIG. 2C). Reaction time was 30 minutes. As a result, a graft copolymer of PMMA 12 and nitrosobenzene 13 was formed in the irradiated resist 14. Then, wafer 11 was dipped in toluene which was a developer for 30 seconds to dissolve the area which was not irradiated with electron beam, namely, where no graft copolymerization reaction occurred, thereby to form negative-type resist pattern 19 (FIG. 2D). By these procedures, resist pattern 19 comprising a polymer and of 0.4 μm in height and 0.2 μm in width was able to be formed.

For comparison, the above procedures were carried out without adding nitrosobenzene 13 to PMMA 12 as in conventional method. Substantially no graft copolymerization reaction took place also in the area which was irradiated with electron beam and when the wafer was dipped in toluene, a developer, for 30 seconds, the resist film was completely dissolved. The graft copolymerization reaction temperature was changed from room temperature to 110° C. to obtain the same result. This indicates that addition of the additive nitrosobenzene 13 improved the graft copolymerization reaction efficiency and thereby it became possible to fabricate resist pattern 19.

Moreover, all of the steps from the irradiation of electron beam to the graft copolymerization reaction were carried out in vacuo using a spare vacuum chamber of the electron beam writing machine as graft copolymerization reaction chamber In this case, the graft copolymerization reaction was effected at 110° C. when nitrosobenzene was added and at room temperature when it was not added. As a result, a resist pattern of 0.4 μm and 0.2 μm in width was able to be formed with addition of nitrosobenzene while height of resist pattern formed was 0.3 μm with addition of no nitrosobenzene. In the case of adding no nitrosobenzene, the graft copolymerization reaction temperature was further raised, but height of resist pattern decreased with elevation of the temperature and no resist pattern was formed at 70° C. The results indicate that addition of nitrosobenzene not only prevents reduction of graft copolymerization reaction efficiency caused by oxygen in the atmosphere, but also contributes to improvement of the graft copolymerization reaction efficiency in vacuo, namely, in non-oxygen atmosphere.

If amount of nitrosobenzene added is too small, sufficient combination with radicals of PMMA cannot be attained and if too much, amount of PMMA which is a material for copolymer decreases and, besides, nitrosobenzene directly becomes radicals to produce a homopolymer. Table 1 shows relation between addition ratio (% by weight) of nitrozobenzene and height of resist pattern formed after exposure to the air (oxygen). From the results it can be seen that an addition ratio of 5–30% by weight is especially suitable. This addition ratio is mostly applicable to other additives mentioned in Example 1.

TABLE 1

| Addition ratio (%) | 2.5 | 5 | 7.5 | 10 | 15 | 20 | 25 | 30 | 35 | 40 |
|---|---|---|---|---|---|---|---|---|---|---|
| Height of pattern (μm) | 0.05 | 0.2 | 0.4 | 0.4 | 0.3 | 0.3 | 0.2 | 0.2 | 0.1 | 0.1 |

γ-ray, ultraviolet ray or X-ray can be used in place of electron beam in Example 2 and in these cases irradiation may be effected in oxygen atmosphere such as in the air. Furthermore, in the graft copolymerization step, ultraviolet ray or visible ray may be used in place of heating for acceleration of the reaction.

EXAMPLE 3

This example shows application of the present invention to X-ray lithography. In the case of X-ray lithography, construction of apparatus can be simplified if atmosphere around the resist during X-ray exposure can be the air. As X-ray source, rotating cathode X-ray source using Mo as a target was used and exposure was carried out with MoLa ($\lambda = 0.54$ nm). X-ray intensity at the surface of water was 0.25 mW/cm$^2$. On the wafer was coated PPhMA (polyphenyl methacrylate) resist containing 10% by weight of nitrosobenzene as an additive at a thickness of 1 $\mu$m and this was subjected to an exposure of 50 mJ/cm$^2$ in the air. Immediately after the exposure, the wafer was put in a graft copolymerization reaction chamber of non-oxygen atmosphere and exposed to acrylic acid as a monomer to effect graft copolymerization reaction. In this example, ultraviolet ray of 350 nm in wavelength was irradiated to accerelate the copolymerization reaction. Graft copolymerization reaction time was 30 minutes. Finally, the resist was developed with toluene to obtain a resist pattern of 1.2 $\mu$m thick and 0.3 $\mu$m wide. Theses steps were all carried out at room temperature.

In the above Examples 1-3, the effects can also be obtained using 2-methyl-2-nitrosopropane, 5,5-dimetyl-1-pyrroline-1-oxide or nitrosopropane which are also spin traps in place of nitrosobenzene and phenyl-N-butylnitrone as additives. When these other spin traps are used, the amount thereof is also desirably in the range of 5-30% by weight referred to hereabove.

What is claimed is:

1. A method for replication of pattern which includes the steps of adding to a resist capable of forming first radicals when irradiated with radiation an additive capable of combining with said first radicals to form second radicals stable against oxygen; coating said resist containing the additive on a substrate; selectively irradiating the resist with radiation; introducing a monomer under an atmosphere free from oxygen, thereby to graft copolymerize said selectively irradiated resist and said monomer; and developing the resist to remove the resist of the area other than the graft copolymerized area.

2. A method according to claim 1 wherein the additive which forms the second radicals is a spin trap.

3. A method according to claim 2 wherein the spin trap is at least one compound selected from the group consisting of phenyl-N-butylnitrone, nitrosobenzene, nitrosopropane, 2-methyl-2-nitrosopropane and 5,5-dimethyl-1-pyrroline-1-oxide.

4. A method according to claim 1 wherein the irradiation step is carried out in an oxygen atmosphere.

5. A method according to claim 4 wherein the oxygen atmosphere is the air.

6. A method according to claim 1 wherein the irradiation step is carried out in a vacuum atmosphere.

7. A method according to claim 1 wherein the resist is heated at the graft copolymerization step.

8. A method according to claim 1 wherein the resist is irradiated with ultraviolet ray or visible ray at the graft copolymerization step.

9. A method according to claim 1 wherein the radiation is ultraviolet ray, electron beam, $\gamma$-ray or X-ray.

* * * * *